United States Patent [19]

Lur et al.

[11] Patent Number: 5,482,885
[45] Date of Patent: Jan. 9, 1996

[54] METHOD FOR FORMING MOST CAPACITOR USING POLY SPACER TECHNIQUE

[75] Inventors: Water Lur, Taipei; Cheng-Hen Huang, Hsin-Chu, both of Taiwan

[73] Assignee: United Microelectronics Corp., Hsin-Chu, Taiwan

[21] Appl. No.: 214,595

[22] Filed: Mar. 18, 1994

[51] Int. Cl.$^6$ ............................ H01L 21/70; H01L 27/00
[52] U.S. Cl. ................... 437/60; 437/52; 437/919
[58] Field of Search ..................... 437/919, 977, 437/52, 60

[56] References Cited

U.S. PATENT DOCUMENTS

| | | | |
|---|---|---|---|
| 4,859,622 | 8/1989 | Eguchi | 437/47 |
| 5,068,199 | 11/1991 | Sandhu | 437/52 |
| 5,110,752 | 5/1992 | Lu | 437/47 |
| 5,134,086 | 7/1992 | Ahn et al. | 437/52 |
| 5,158,905 | 10/1992 | Ahn | 437/52 |
| 5,164,881 | 11/1992 | Ahn | 361/313 |
| 5,182,232 | 6/1993 | Chhabra et al. | 437/200 |
| 5,204,280 | 4/1993 | Dhong et al. | 437/52 |
| 5,213,992 | 5/1993 | Lu | 437/52 |
| 5,227,322 | 7/1993 | Ko et al. | 437/47 |
| 5,244,842 | 9/1993 | Cathey et al. | 437/228 |
| 5,254,503 | 10/1993 | Kenney | 437/65 |
| 5,256,587 | 10/1993 | Jun et al. | 437/52 |
| 5,302,540 | 4/1994 | Ko et al. | 437/47 |
| 5,304,828 | 4/1994 | Kim et al. | 257/309 |
| 5,308,786 | 5/1994 | Lur et al. | 437/67 |
| 5,313,100 | 5/1994 | Ishii et al. | 257/751 |
| 5,332,696 | 6/1994 | Kim et al. | 437/233 |
| 5,342,800 | 8/1994 | Jun et al. | 437/52 |
| 5,350,707 | 9/1994 | Ko et al. | 437/52 |

FOREIGN PATENT DOCUMENTS 3266460  3/1990  Japan.
2308551 12/1990  Japan.

OTHER PUBLICATIONS

Wolf et al., *Silicon Processing For the VLSI Era*, vol. I, Lattice Press 1986, pp. 400–1, 581.

Jun et al., *The Fabrication and Electrical Properties of Modulated Stacked Capacitor for Advanced DRAM Applications*, IEEE (1992).

IBM Technical Disclosure, *Method of Increasing Capacitance Area Using RIE Selectivity*, vol. 35, No. 7 (Dec. 1992).

*Primary Examiner*—George Fourson
*Assistant Examiner*—H. Jey Tsai
*Attorney, Agent, or Firm*—Meltzer, Lippe et al.

[57] ABSTRACT

A MOST capacitor for use in a DRAM cell is formed by depositing a conductive polysilicon electrode layer on the substrate. Oxide lines are then formed on the polysilicon layer. Using the oxide lines as a mask, pillars are etched in the polysilicon electrode layer.

1 Claim, 3 Drawing Sheets

METHOD FOR FORMING MOST CAPACITOR USING POLY SPACER TECHNIQUE

FIELD OF THE INVENTION

The present invention relates to a technique for forming a modulated stacked capacitor for use in a Dynamic Random Access Memory (DRAM) cell.

BACKGROUND OF THE INVENTION

A DRAM cell typically comprises a MOS transistor and a capacitor. An example of such a DRAM cell is shown in FIG. 1. The DRAM cell 10 of FIG. 1 comprises the MOSFET 12 and the capacitor 14. A word line is connected to the gate of the MOSFET 14. A bit line is connected to the source of the MOSFET 12. The capacitor 14 is connected to the drain of the MOSFET 12. The state of the DRAM cell 10 is determined by whether or not the capacitor 14 is holding a charge.

The DRAM cell is read by using the bit line to determine whether or not a charge is stored in the capacitor. The DRAM cell is written by using the bit line to add or remove charge from the capacitor. However, the cell can only be read or written when the cell is addressed (i.e. activated) by the word line.

With the continuous advancement of DRAM technology, the chip area used for one DRAM cell is getting smaller. There are two methods used to increase the capacitance of the capacitor in the DRAM cell. One method is to decrease the effective dielectric thickness and the other method is to increase the effective capacitor surface area.

It is expected that future scaled DRAM cells will rely heavily on the quality and storage capacity of ultra thin dielectric materials that are sandwiched between two heavily doped polysilicon and/or silicon electrodes. However, higher capacitance values cannot be obtained without seriously degrading the device retention time. Specifically, films thinner than 50 angstroms present excessive leakage current due to direct carrier tunneling. For a given capacitor dielectric film, the larger the surface area, the larger the capacitance.

FIGS. 2, 3, 4, 5 and 6 illustrate prior art Dram cells. The DRAM cell 20 of FIG. 2 comprises a MOSFET 22 and a capacitor 24 which are both formed on a silicon substrate 25. The MOSFET 22 comprises the source and drain regions 26 and 28, which regions are separated by the channel 29. It should be noted that the source and drain regions 26, 28 have a conductivity type opposite to that of the substrate. A metal contact 27 directly contacts the source region 26. A gate 30 is formed from polysilicon material (Poly-1) and is separated from the surface of the substrate by an oxide layer 31. An additional oxide region 32 is on top of the gate 30.

The capacitor 24 sits on top of the drain region 28. The capacitor 24 has a first electrode 40 formed by a conducting polysilicon material (poly-2), a thin dielectric layer 42 which may be NO or ONO, and a second electrode 44 which is formed from a conducting polysilicon material (poly-3). The capacitor contacts the drain region 28 in a space between the oxide region 32 and the oxide region 52.

FIG. 3 shows a DRAM cell 20' which is similar to the DRAM cell 20 of FIG. 2. The main difference is that the shape of the poly-2 electrode layer 40, dielectric layer 42 and poly-3 electrode layer 44 have been altered to increase the surface area of the capacitor 24.

FIG. 4 shows a DRAM cell 20" in which the poly-2 electrode 40 has been made rugged to increase the surface area of the capacitor.

FIG. 5 shows a DRAM cell 20'" in which the polysilicon electrode 40 is formed from a plurality of horizontal layers 41 to increase the surface area of the capacitor.

Another capacitor structure which can be used to increase the capacitance of a DRAM cell is known as MOST (modulated stacked) capacitor. (See e.g. Y. K. Jun et al, "The Fabrication and Electrical Properties of Modulated Stacked Capacitor for Advance DRAM Applications" IEEE Electron Device Letters, Vol. 13, No. 8, August 1992, the contexts of which are incorporated herein by reference).

A DRAM cell 20"" having a MOST capacitor structure is illustrated in FIG. 6. In the capacitor 24 of FIG. 6, the poly-2 electrode 40 comprises a plurality of spaced apart vertical pillars 43. The capacitor dielectric 42 and poly-3 electrode 44 are then deposited over the spaced apart vertical pillars 43. In this manner a capacitor with a large effective surface area is formed in a DRAM cell.

It is an object of the present invention to provide a technique for manufacture of a MOST capacitor for use in a DRAM cell.

SUMMARY OF THE INVENTION

A MOST capacitor for use in a DRAM cell is formed by depositing a conductive polysilicon electrode layer on the substrate. Oxide lines are then formed on the polysilicon layer. Using the oxide lines as a mask, pillars are etched in the polysilicon electrode layer.

DETAILED DESCRIPTION OF THE INVENTION

Figure 1:
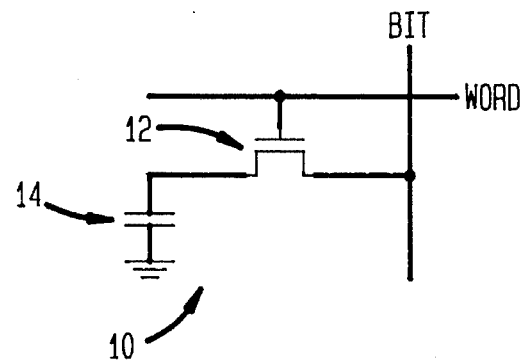
FIG. 1 schematically illustrates DRAM cell.
Figure 2:
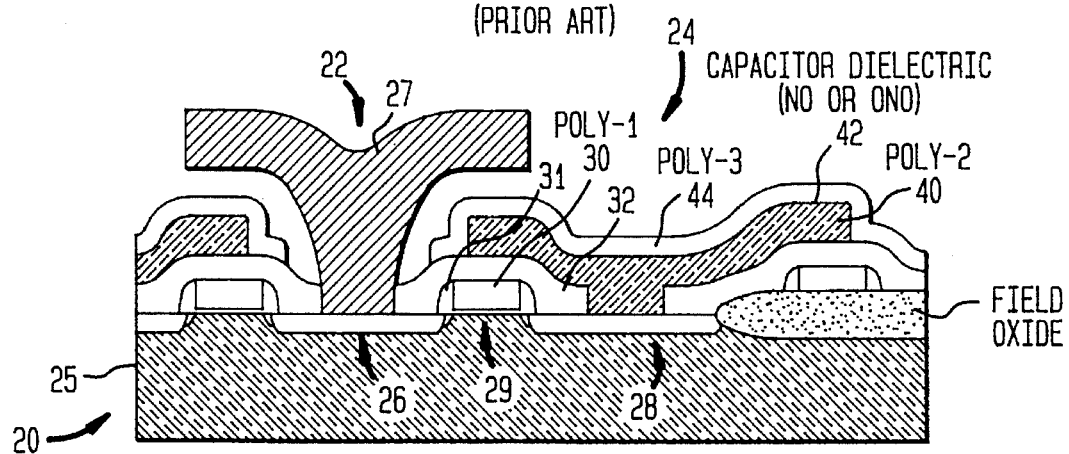
FIGS. 2–6 illustrate various prior art capacitors utilized in DRAM cells.
Figure 3:
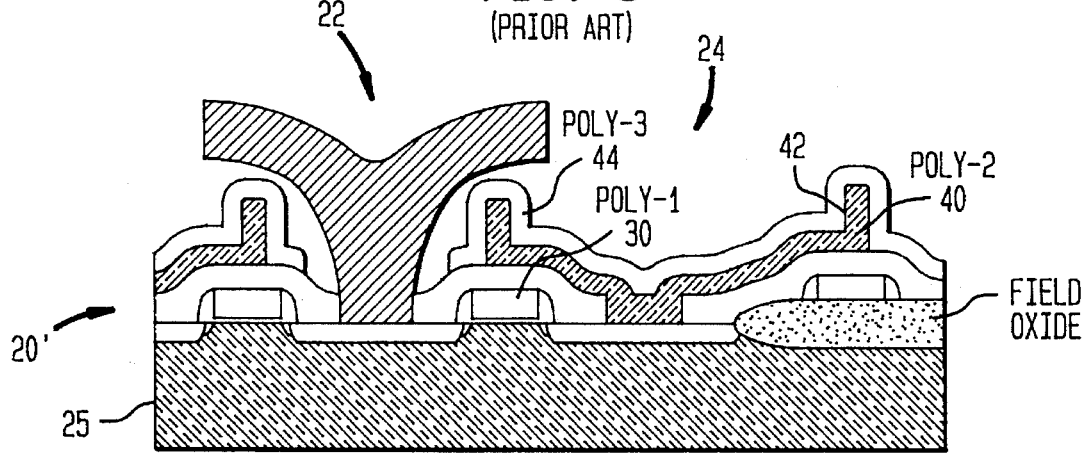
Figure 4:
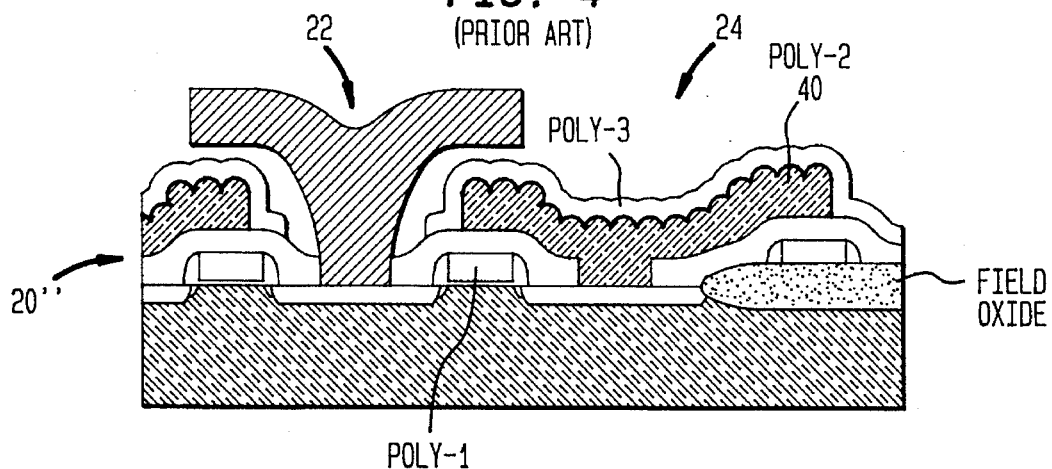
Figure 5:
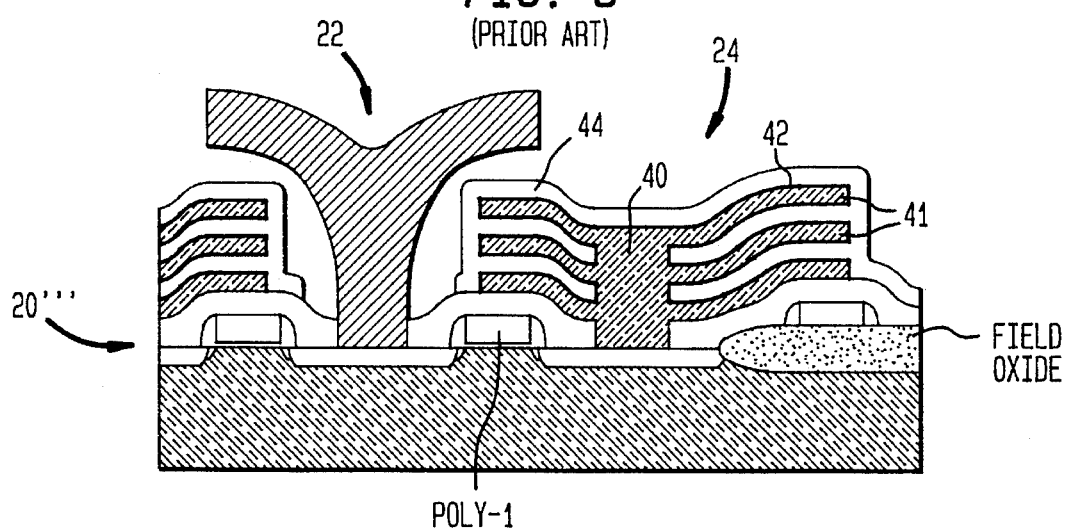
Figure 6:
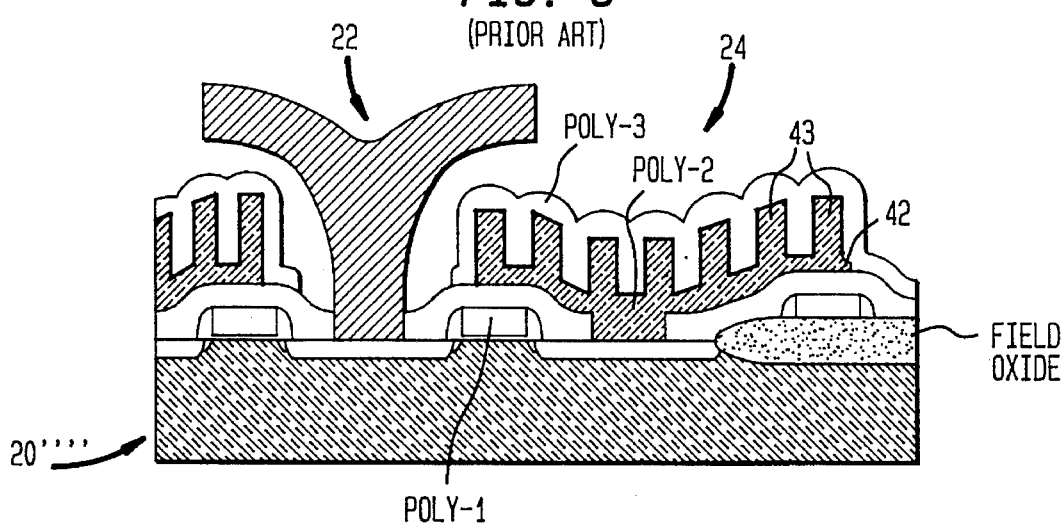
Figure 7A:
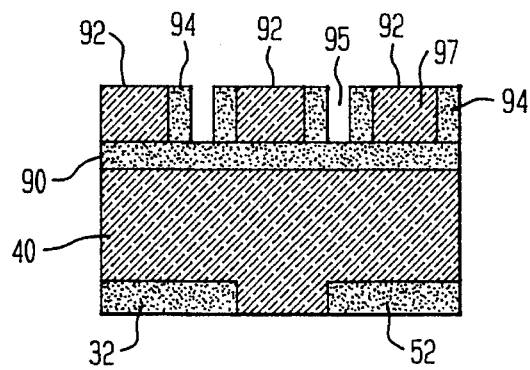
FIGS. 7(a), 7(b), 7(c), and 7(d) illustrate a technique for forming a MOST capacitor for use in a DRAM cell in accordance with the present invention.

The MOST capacitor 24 of the present invention is formed as follows:

1. As shown in FIG. 7(a), a polysilicon (poly-2) electrode layer 40 is deposited on the oxide regions 32 and 52 and on the drain region 28 of the substrate 25 (not shown in FIG. 7(a), but see FIGS. 2–6) after the formation of polycontact.

2. The polysilicon layer 40 is doped with $POCl_3$ or ion implanted with phosphorous, arsenic or the like to become conductive.

3. A thin oxide layer 90 is deposited on the polysilicon layer 40 with a thickness of between 500–2,000 Å to act as a mask during the etching of the polysilicon electrode layer 40.

4. A nitride ($Si_3N_4$) layer with a thickness of 2,000–5,000 Angstroms is deposited on the oxide layer 90 and patterned by a conventional lithography method with a feature size of 0.6 micron, for example, to form the nitride regions 92. The oxide layer 90 will act as an end point for nitride etching.

5. Polysilicon spacers 94 are formed on the side walls of the nitride regions 92. The polysilicon spacers have a thickness of about 2,000 Angstroms. The poly spaces 94 are separated by narrow spaces 95 and wide spacers 97, which wide spacers 97 are filled with $Si_3N_4$ regions 92.

6. The nitride regions 92 are stripped in hot $H_3PO_4$.

Figure 7B:
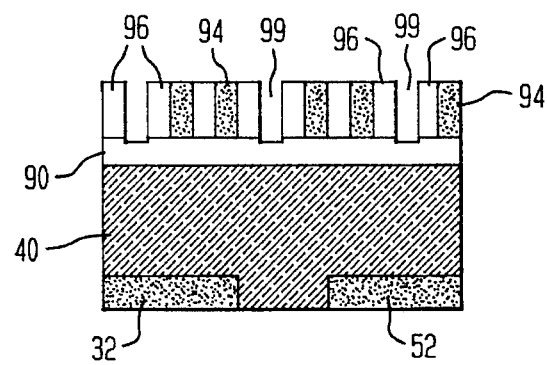

7. Oxide spacers 96 with a thickness of about 2000 Angstroms are formed on the sidewalls of the polysilicon spacers 94, as shown in FIG. 7(b). The narrow spaces 95 (see FIG. 7(a)) are now filled with the oxide spaces 96, while the wide spaces 97 (see FIG. 7(a)) are now filled with the oxide spacers 96 in a manner so that gaps 99 remain.

8. The poly spacers 94 are etched away by conventional reactive ion etching. There remains the oxide spacers 96 standing on the oxide layer 90.

Figure 7C:
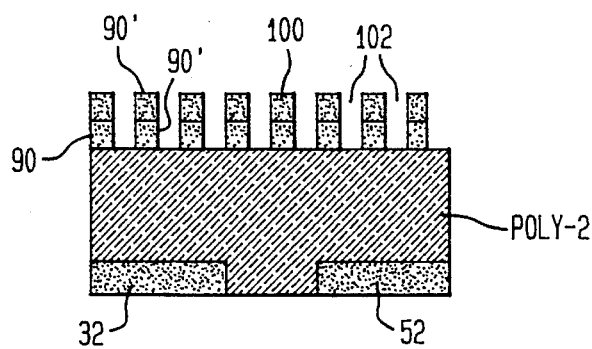

9. The oxide layer 90 and spacers 96 are then etched to form the oxide lines 100 with a spacing and width of about 2,000 Angstroms. The lines 100 are shown in FIG. 7(c). Each line 100 includes a portion 90' of the oxide layer 90 and a portion 96' of a spacer 96. The polysilicon layer 40 is exposed in the openings 102.

Figure 7D:
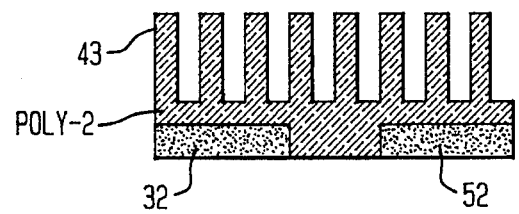

10. Using the oxide lines 100 as a mask the polysilicon layer 40 is then etched to a depth of about 4,000–8,000 Angstroms. The oxide lines 100 are then dipped away using HF solution. The result is the pillars 43 shown in FIG. 7(d). The pillars 43 of FIG. 7(d) have the shape of walls which extend perpendicular to the plane of the figure.

11. The capacitor dielectric layer 42 (see FIG. 6) is then formed on top of the pillars (i.e. walls) 43 of the polysilicon electrode layer 40. The dielectric layer 42 may be ON or ONO.

12. The polysilicon electrode layer 40 and the dielectric layer 42 are then etched to isolate the capacitor.

13. A second polysilicon electrode layer 44 (see FIG. 6) is then deposited on the dielectric layer 42. The polysilicon electrode layer 44 is doped so that it is conducting and is etched to complete the capacitor structure.

14. Another dielectric layer, usually borophosphosilicate glass or the like (not shown) is deposited on the polysilicon electrode layer 44 and then etched to form openings for a subsequent metalization step.

15. The metalization is deposited and etched to form contacts (e.g. contact 27) to complete the capacitor structure.

Finally, the above-described embodiments of the invention are intended to be illustrative only. Numerous alternative embodiments may be devised by those skilled in the art without departing from the spirit and scope of the following claims.

What is claimed is:

1. A method for forming a capacitor for use in a DRAM cell, comprising the steps of:

(a) forming a conductive polysilicon electrode layer on a substrate;

(b) forming an oxide layer on the polysilicon electrode layer;

(c) forming oxide spaces on said oxide layer, comprising the steps of:

(i) forming spaced apart nitride regions on said oxide layer;

(ii) forming polysilicon spacers on the side walls of said nitride regions;

(iii) removing said nitride regions; and (iv) forming said oxide spaces on the side walls of said polysilicon spacers and removing said polysilicon spacers;

(d) etching said oxide spaces and said oxide layer to form oxide lines on said polysilicon electrode layer;

(e) using said oxide lines as a mask, etching said polysilicon electrode layer to form pillars therein;

(f) forming a dielectric layer on said polysilicon electrode layer; and (g) forming a second polysilicon electrode layer on said dielectric layer.

* * * * *